July 7, 1970 F. G. LENTZ 3,518,752

METHOD OF AND APPARATUS FOR LOADING SEMICONDUCTOR DEVICES

Filed July 28, 1967 2 Sheets-Sheet 1

INVENTOR
F. G. LENTZ
BY R. P. Miller
ATTORNEY

July 7, 1970 F. G. LENTZ 3,518,752

METHOD OF AND APPARATUS FOR LOADING SEMICONDUCTOR DEVICES

Filed July 28, 1967 2 Sheets-Sheet 2

United States Patent Office 3,518,752
Patented July 7, 1970

3,518,752
METHOD OF AND APPARATUS FOR LOADING SEMICONDUCTOR DEVICES

Forrest G. Lentz, Bethlehem, Pa., assignor to Western Electric Company, Incorporated, New York, N.Y., a corporation of New York Filed July 28, 1967, Ser. No. 656,754
Int. Cl. B23p *19/04*
U.S. Cl. 29—588 7 Claims

ABSTRACT OF THE DISCLOSURE

An array of transistor headers are loaded into an apertured tray so that paramagnetic leads of the headers extend downwardly, after which a transfer device is clamped to the tray. The tray and transfer device are inverted and positioned over a workholder having a matching array of cans. A shutter is slidably moved within the transfer device to permit the headers to drop through guide apertures in the transfer device and into the cans. An operator moves a magnetic wand over the tray and agitates the leads of the headers to assure the seating of the headers in the cans.

BACKGROUND OF THE INVENTION

Field of the invention

This invention relates to a method of and apparatus for loading semiconductor devices, and more particularly, to a method of and apparatus for loading a plurality of transistor headers, having leads extending therefrom, into a plurality of aligned metal envelopes.

Description of the prior art

In the manufacture of transistors, a conventional procedure for loading a plurality of transistors includes the supporting of a plurality of metal envelopes commonly known in the art as transistor cans, after which a plurality of transistor headers, aligned with the cans by means of a template or jig, are assembled with the cans for subsequent processing such as encapsulation.

Heretofore, the transistor headers, each of which has a plurality of wire leads extending therefrom, had to be loaded into the cans individually and manually. Since the leads extending from the transistor headers are very fine, the prior art manual method of loading has been a painstaking, tedious, and time consuming process.

Moreover, difficulty has been encountered in that the headers, and especially the leads depending therefrom, are very susceptible to damage or deformation in and during the various hand manipulations which have been required in taking the transistor headers from a supply and loading them into a rack. Because of the extremely small diameter of the wire-like leads, the leads are highly vulnerable to bending or breaking.

Generally then, the loading operation used in the past, and as carried out by the prior art, has been very expensive, both with respect to time and with respect to the considerable amount of waste or spoilage resulting from inadvertent deformation of the transistors. There is still a need for a method and apparatus which can be used to efficiently load a multiplicity of transistor headers into an aligned coordinate array of cans for subsequent processing.

SUMMARY OF THE INVENTION

Accordingly, it is an object of this invention to provide a new and improved method for loading transistor headers into aligned transistor cans.

Another object of this invention resides in a method and apparatus for loading and holding a plurality of transistor headers in a coordinate array in a loading try and to thereafter invert the tray against an array of transistor cans whereafter the headers are released to drop into the cans with an operator using an auxiliary magnetic wand to jiggle any misaligned headers to permit the misaligned headers to drop completely and seat in the cans.

With these and other objects in mind, the present invention contemplates a method of and apparatus for semiautomatic loading of a coordinate array of articles, each of the articles having a plurality of fragile wire-like leads extending therefrom, into an aligned coordinate array of covers with provision for an auxiliary device for agitating misaligned articles for completing the seating of the articles into the covers.

More particularly, a plurality of transistor headers, each of the headers having several lead wires depending therefrom, are placed in a coordinate array of apertures in a tray. Then, a transfer device, having an array of apertures aligned with the apertures in the tray, is placed over the tray with a shutter or gate slidably movable within the transfer device to cover the apertures therein. The tray and the transfer device are then inverted as a unit and placed over and in alignment with a plurality of transistor cans which had previously been positioned in a workholder. The gate in the transfer device is slidably moved to permit the transistor headers in the tray to drop by gravity into engagement with the transistor cans in the workholder below the transfer device.

In the event that any of the lead wires depending from the transistor headers tilt and engage the walls of the apertures in the tray or the transfer devices to prevent the descent of the transistor header to completely seat within the can associated therewith, an operator passes a magnetic wand back and fourth across the coordinate array of apertures in order to agitate the lead wires and free the lead wires from engagement with the tray or transfer device to permit the further descent of the transistor headers into the aligned cans.

Other objects and advantages of the present invention will be apparent from the following detailed description when considered in conjunction with the drawings wherein:

DETAILED DESCRIPTION OF THE INVENTION

Figures 1, 2:
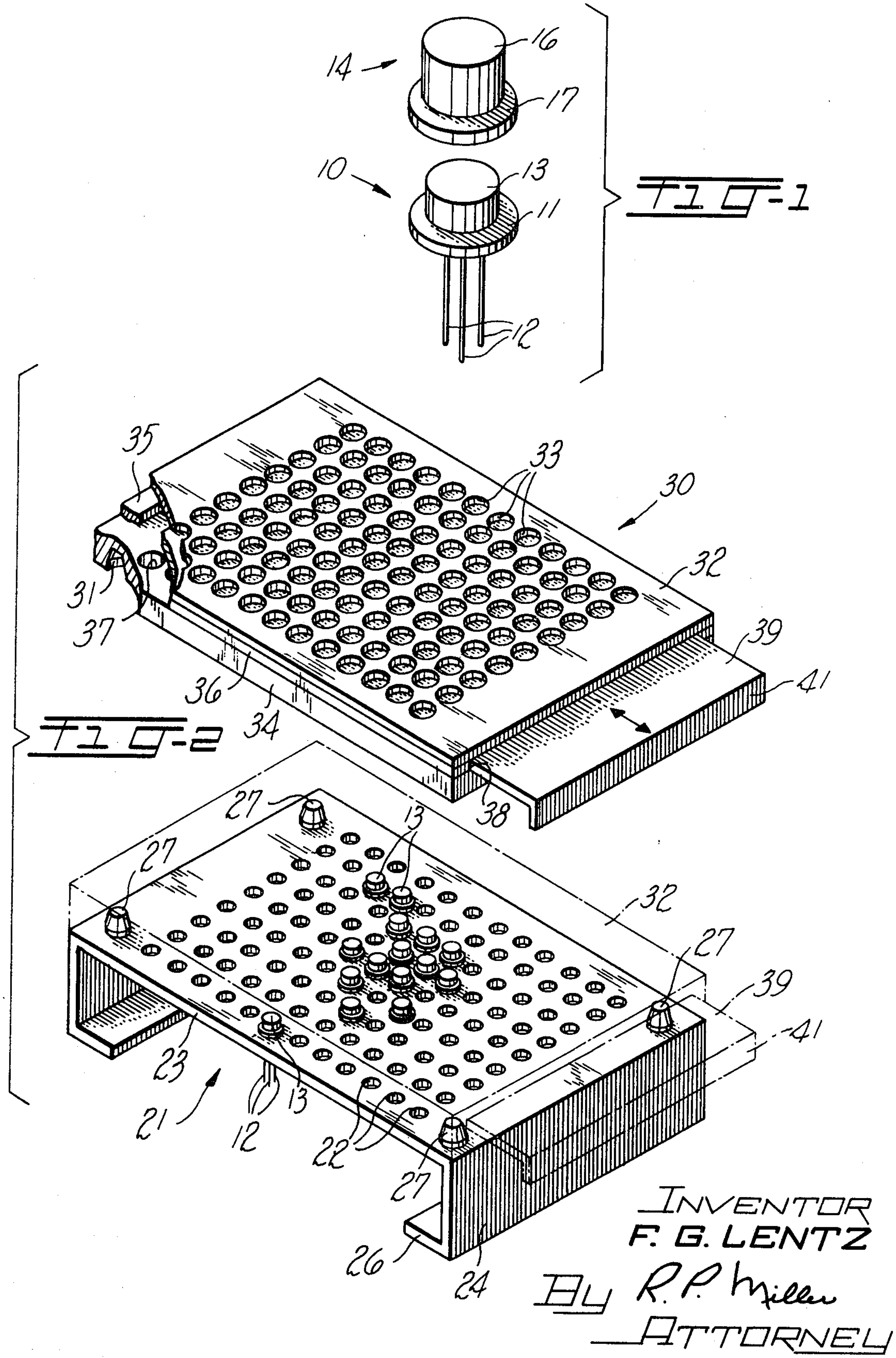
FIG. 1 is a perspective exploded view of a transistor header assembly, a predetermined number of which headers are loaded into a workholder for subsequent processing by the method and apparatus of the present invention.
FIG. 2 is an exploded perspective view of a tray, into which a plurality of transistor headers are loaded, together with a transfer device in alignment with, and for attachment to, the tray.

Referring now to FIG. 1, there is shown a transistor header 10 having a flange 11 with a plurality of paramagnetic wire-like leads 12 depending therefrom. A stud 13 is attached to the other side of the flange 11. The stud 13 of the transistor header 10 is to be loaded by the method and apparatus of the present invention into a can 14 for subsequent processing. Each of the cans 14 has a body portion 16 and a flange 17. The body portion 16 of the can 14 is proportioned so that it may receive the stud portion 13 of a header 10. Moreover, the method of and apparatus of the present invention permits a plurality of transistor headers 10 to be loaded simultaneously, rather than individually, into an aligned plurality of cans 14 filled with a drying agent.

Referring now to FIG. 2, there is shown a handling tray 21 having a plurality of apertures 22 formed in a top or retaining plate 23 thereof. The handling tray 21 is supported on a pair of side plates 24, each of which terminates in an inturned base portion 26. Each of the apertures 22 in the top plate 23 is proportioned so that the diameter of the aperture will permit an operator to place a transistor header 10 on the top plate with the paramagnetic leads 12 extending through the aperture. Moreover, the size of the aperture 22 is such that when the header is placed over the aperture, the flange 11 of the header 10 will prevent the header from falling through the aperture.

In the initial step for practicing the method of the present invention, an operator places a multiplicity of the transistor headers 10 in the apertures 22 in the top plate 23 of the handling or initial load tray 21 so that the paramagnetic leads 12 of the headers are extending downwardly from the underside of the top plate (see FIG. 2). In order to arrange additional apparatus with the loading tray 21 in subsequent steps used to carry out the method of the present invention, a tapered dowel pin 27 is secured to the top plate 23 in each corner thereof. These dowel pins 27 serve as guides for aligning and positioning a transfer device, designated generally by the numeral 30, over the coordinate array of transistor headers 10.

The transfer device 30 comprises a guide plate 32 having a coordinate array of apertures 33 which, in turn, match with the coordinate array of apertures 22. The guide plate 32 is separated from a bottom, or a header receiving plate 34 by an end spacer block 35 and side spacer blocks or guides 36. The bottom plate 34 has a coordinate array of apertures 37 (see FIG. 4) formed therein and aligned with the apertures 33 in the guide plate 32. Moreover, the bottom plate 34 has a tapered cavity 31 formed in each corner of the bottom surface thereof for receiving one of the dowel pins 27 (see FIG. 4).

Figure 5:
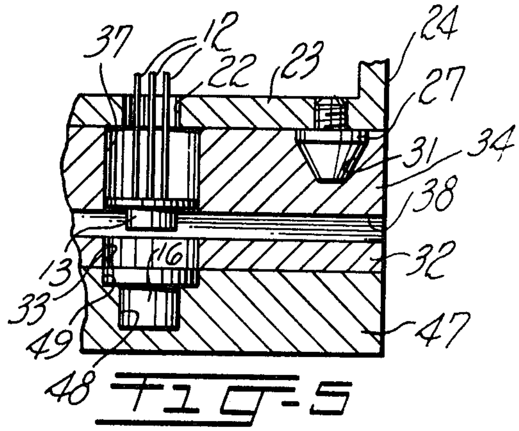

The guide plate 32 and bottom plate 34, together with the spacer blocks 35 and 36, define a slot 38 (see FIG. 5) in which is slidably positioned a shutter or gate 39. The gate 39 has a depending portion 41 which engages the bottom plate 34 when the gate is completely within the slot 38.

The operator places the transfer device 30 over the handling tray 21 so that the dowel pins 27 are received in the cavities 31 of the bottom plate 34 whereupon the studs 13 of the transistor headers 10 protrude into the apertures in the bottom plate 34 of the transfer device 30. Before proceeding, the operator then slidably moves the gate 39 so that the gate covers the apertures 33 formed in the guide plate 32 and the apertures 37 in the bottom plate 34 of the transfer device (see FIGS. 2 and 4). The operator secures the transfer device 30 to the handling tray 21 by any of many well-known securing devices used throughout the art, such as C-clamps.

In a prior operation, a can 14 filled with a drying agent is placed in each of the cavities in the mask 47 with the body portion 16 positioned in the small diameter portion 48 and the flange 17 positioned in the large diameter portion 49 of the stepped cavity.

Figure 3:
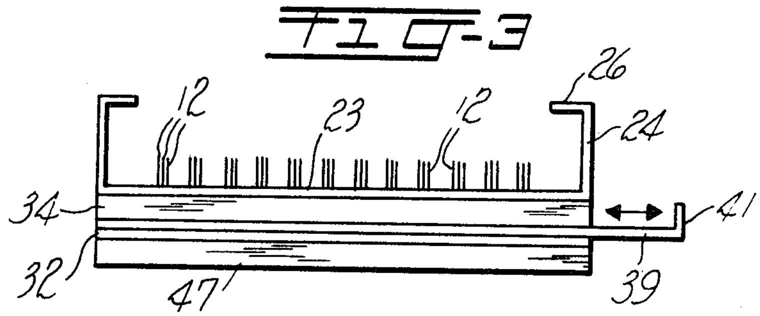
FIG. 3 is a side elevational view, showing the tray, loaded with transistor headers, and the transfer device, inverted as a unit, and placed over a plurality of transistor cans which had previously been placed in a workholder.
Figure 8:
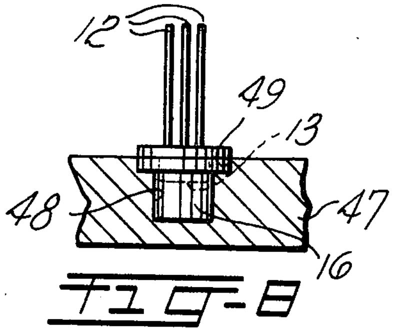
FIG. 8 is a side elevational detailed view, partially in section, and showing the transistor header loaded into a transistor can in the workholder after the tray and transfer device have been removed.

Then the operator inverts the handling tray 21 and transfer device 30 as a unit to position the tray and transfer device over and in alignment with a coordinate array of stepped cavities which have been formed in a mask or plate-like workholder 47 (see FIG. 3). Each of the stepped cavities has a small diameter lower portion 48 and a large diameter upper portion 49 (see FIG. 8).

Figure 4:
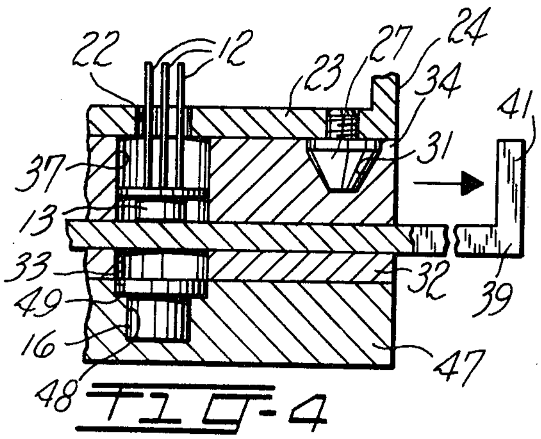
FIGS. 4–6 are a series of detailed views, in section, taken through a part of the apparatus of the present invention and showing the sequence of operations for actuating a gate in the transfer device to permit the transistor headers to fall into engagement with the transistor cans in the workholder.

When the operator inverts the handling tray 21 and the transfer device 30 over the mask 47, the transistor headers 10 in the handling tray drop by gravity so that the flange 11 of each of the headers moves out of engagement with the top plate 23 of the handling tray (see FIG. 4). Moreover, the descent of the transistor headers 10 is stopped when the studs 13 engage the gate 39 which had previously been moved into the slot 38 by the operator so that the gate covers the apertures 33 and 37 in the guide and bottom header receiving plates, respectively, of the transfer device 30.

With the handling tray 21 and transfer device 30 positioned over the coordinate array of filled cans 14, the operator next slidably moves the gate 39 and then removes the gate from the slot 38, whereupon the apertures 33 in the guide plate 32 are exposed to the apertures 37 in the bottom plate 34 of the transfer device. When the apertures 33 and 37 in the transfer device 31 are exposed to each other, the transistor headers 10 drop by gravity until the studs 13 seat in the cans 14 positioned in the cavities 46 in the mask 47 (see FIG. 5) and the flange 11 engages the flange 17 of the cans.

Figure 6:
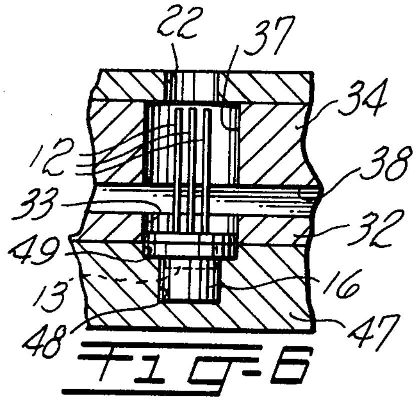
Figure 7:
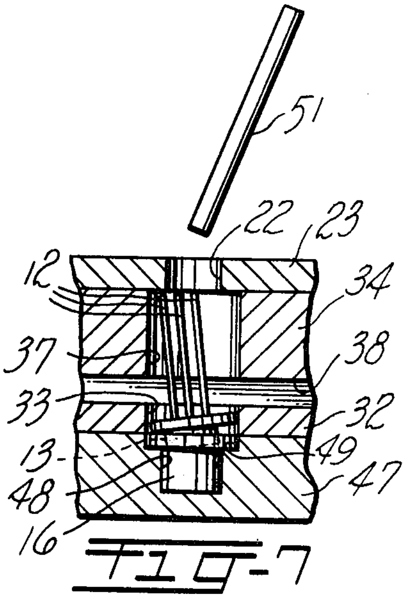
FIG. 7 is a side elevational detailed view, in section, which shows the employment of a magnetic wand to agitate the paramagnetic leads of one of the transistor headers which has become entangled in the side walls of one of the apertures in the tray and transfer device.

It is entirely possible that in some instances, the paramagnet depending leads 12 of the transistor headers 10 may be cocked within the aligned apertures in the tray 21 and the transfer device 30, so that the header may not drop completely through the transfer device to seat in one of the cans 14 (see FIG. 6). It is also possible that the transistor header could drop to engage the can 14, but could be angled thereto, as depicted in FIG. 7, so that the flange 11 of the header does not seat completely in the can.

In order to make certain that all of the headers 10 are completely seated in the aligned cans 14 before removing the handling tray 21 and the transfer device 30, the operator manually moves a magnetic wand 51 (see FIG. 7) back and forth across the coordinate array of apertures 22 above the handling tray 21. As the magnetic wand 51 is moved back and forth across the apertures, the paramagnetic leads 12 of the transistor headers 10 are magnetically attracted and mechanically agitated so that the leads of any improperly seated headers are freed from engagement with the walls of the handling tray or transfer device to permit the headers to completely drop into the aligned cans 14.

Then the operator removes the handling tray 21 and the transfer device 30 as a unit by moving the unit vertically upward off the mask 47 until the transfer device is past the ends of the depending paramagnetic leads 12 whereupon the operator inverts the tray and transfer device into the original position shown in FIG. 2. The operator then disengages the tray 21 from the transfer device 30 for another cycle of loading. Now, the loaded mask 47 (see FIG. 8), with a multiplicity of transistor headers 10 seated in the cans 14, is ready for a subsequent operation, such as encapsulation.

Although a particular agitating means, such as the magnetic wand 51 was used in the embodiment described hereinbefore, it is entirely within the purview of this invention to use other devices which accomplish the same function. For example, it would be within the scope of this invention to vibrate the handling tray 21 and the transfer device 30 after the tray and transfer device have been placed over the mask 47 by using a magnetic vibrator.

It is to be understood that the above-identified embodiments are simply illustrative of the principles of the invention and numerous other modifications may be devised without departing from the spirit and scope of the invention.

I claim:

1. A method of assembling headers into cans where each header comprises a body portion having a flange with leads extending from said body portion, which comprises:

supporting an array of said headers along said flanges;
confining said headers in a vertical direction;
inverting said array of supported and confined headers;
positioning said array of headers over an aligned array of cans;
releasing said headers to drop vertically into said cans; and
agitating said headers to completely seat said headers in said cans.

2. A method of assembling headers into cans where each header comprises a flanged body of circular configuration having an array of leads axially projecting from the body, which comprises:

loading the headers into an apertured tray with the leads depending through the apertures and the headers being supported by the flanges;
confining the headers in the apertures in the tray;
loading the cans in a recessed support with open ends of the cans being exposed;
inverting said tray and headers to extend said leads upwardly;
placing said tray on said support with the apertures aligned with said recesses and said headers confined between said recessed support and said tray; and then
releasing said headers for descent into said cans.

3. A method of assembling headers into cans where each header comprises a flanged body of circular configuration having an array of leads axially projecting from the body, which comprises:

loading the headers into a first apertured plate with the leads depending through the apertures and the bodies being supported by the flanges;
placing a second apertured plate over the loaded headers;
positioning a plate over the second apertured plate to confine the bodies in the apertures in the second plate;
loading the cans in a recessed support with open ends of the cans being exposed;
inverting said first and second apertured plates along with said confining plate;
placing said first and second apertured plates on said support with the apertures aligned with said recesses and said confining plate interposed between said recessed support and said second apertured plate; and then
removing said confining plate to drop said headers through said second apertured plate into said cans.

4. In an apparatus for loading a plurality of flanged cylindrical parts into a plurality of can-like parts having an open end for receiving said cylindrical part, said cylindrical parts having wires extending therefrom;

means for holding an array of said can-like parts with the open end of said can-like parts oriented upwardly;
a transfer device having a plurality of apertures formed therethrough, said apertures congruent with said array of can-like parts, said transfer device having a slot formed therein, said slot transverse to the axes of said apertures;
a handling tray having an array of apertures formed therein and aligned with said array of can-like parts, said apertures being smaller than the flanges of said cylindrical parts, said tray positioned over said transfer device with the body portion of a cylindrical part in one of said apertures in said transfer device and the wires of said cylindrical part extending through the aligned aperture in said tray;
a gate slidably positioned within said slot in said transfer device to retain said cylindrical parts from falling through said apertures in said transfer device; and
means attached to said gate for slidably moving said gate within said slot to uncover said apertures in said transfer device to permit said cylindrical parts to descend into said can-like parts.

5. In an apparatus for loading flanged headers having axially extending leads into open-ended cans;

a plate-like workholder having an array of can receiving cavities for supporting said cans with their open ends exposed;
a guide plate on said workholders, said guide plate having an array of guide apertures aligned within said array of cavities;
a header receiving plate having an array of apertures aligned with said guide apertures, said apertures being of a diameter such that the flanged headers are received therein;
a retaining plate on said header receiving plate having an array of apertures aligned with said header receiving apertures, said apertures being of a diameter smaller than the diameters of said flanged headers and positioned to receive the leads axially extending from said headers;
a plate interposed between said guide plate and said header receiving plate for supporting said headers in said receiving plate apertures with the leads extending through the apertures in said retaining plate; and
means mounting said support plate for movement to uncover said apertures in said header receiving plate whereupon said headers drop through said apertures in said guide plate into said cans.

6. In an apparatus as defined in claim 5, wherein:

a pair of side plates are attached to opposed ends of said retaining plate and extend perpendicularly to said retaining plate distances which are greater than the lengths of said axially extending leads.

7. A method of loading a cylindrical member having a peripheral flange and a plurality of longitudinally extending wires in an open-ended member having a cup-shaped projection for receiving the cylindrical member, which comprises:

loading an array of cylindrical members in an apertured first support plate with the flanges overlying the edges of the support plate about the apertures and the wires depending through the apertures;
placing an apertured second support plate over the cylindrical members with the flanges positioned within the apertures of the second support plate;
placing a confining plate over the apertures in the second support plate;
inverting the first and second support plates and the confining plate to drop the cylindrical members against the confining plate;
loading an apertured workholder with an array of said open-ended members corresponding to the array of cylindrical members with the open ends exposed;
positioning the first and second support plates and the confining plate over the array of open-ended members with the array of cylindrical members aligned with the open ends of the array of open-ended members; and sliding the confining plate from the cylindrical members to drop the cylindrical members within the open ends of the open-ended members.

References Cited

UNITED STATES PATENTS

| | | | |
|---|---|---|---|
| 2,355,643 | 8/1944 | Grover | 214—301 |
| 2,387,672 | 10/1945 | Mayberry | 86—23 |
| 2,510,555 | 6/1950 | Christie | 86—23 |
| 2,694,374 | 11/1954 | Lindner | 112—186 |
| 2,726,771 | 12/1955 | Cozzoli. | |
| 2,977,006 | 3/1961 | Curry | 214—301 |
| 3,221,394 | 12/1965 | Pitts | 29—588 |
| 3,241,222 | 3/1966 | Timmermans | 29—203 |
| 3,276,854 | 10/1966 | Felker | 29—203 X |
| 3,386,156 | 6/1968 | Griesemer et al. | 29—203 X |
| 3,414,962 | 12/1968 | Altamura | 29—428 |
| 3,299,502 | 1/1967 | Wanesky | 29—588 X |

JOHN F. CAMPBELL, Primary Examiner

D. C. REILEY, Assistant Examiner

U.S. Cl. X.R.

29—25.35, 592, 428, 203; 86—23; 214—301